United States Patent [19]
Hino et al.

[11] Patent Number: 6,087,758
[45] Date of Patent: Jul. 11, 2000

[54] PIEZOELECTRIC VIBRATION DEVICE

[75] Inventors: Taketoshi Hino, Toyama; Tomoaki Futakuchi; Yoshikatsu Maeda, both of Takaoka, all of Japan

[73] Assignee: Murata Manufacturing Co., Ltd., Japan

[21] Appl. No.: 09/116,635

[22] Filed: Jul. 16, 1998

[30] Foreign Application Priority Data

Jul. 17, 1997 [JP] Japan .................................... 9-192783

[51] Int. Cl.⁷ .................................................. H01L 41/08
[52] U.S. Cl. ............................ 310/320; 310/366; 310/367
[58] Field of Search ............................ 310/320, 366–368, 310/370

[56] References Cited

U.S. PATENT DOCUMENTS

| | | | |
|---|---|---|---|
| 3,697,766 | 10/1972 | Ganter et al. | 310/366 |
| 4,196,407 | 4/1980 | Masaie et al. | 310/366 X |
| 4,564,825 | 1/1986 | Takahashi et al. | 310/366 X |

FOREIGN PATENT DOCUMENTS

| | | | |
|---|---|---|---|
| 58-135128 | 9/1983 | Japan . | |
| 0003222 | 1/1985 | Japan | 310/320 |
| 1-59326 | 4/1989 | Japan . | |

Primary Examiner—Mark O. Budd
Attorney, Agent, or Firm—Graham & James LLP

[57] ABSTRACT

A piezoelectric vibration device is constructed to suppress interference between resonance sections and achieve a satisfactory resonance characteristic and sufficient mechanical strength. In the piezoelectric vibration device, a plurality of resonance sections are provided on a piezoelectric substrate and a slit is provided so as to extend from one side of the piezoelectric substrate toward a center thereof in order to suppress interference between the resonance sections. If the length of the slit is denoted as a, the gap width along the opposing direction of the first and second resonance electrodes in the resonance section as g, the distance from the center of the gap to the nearest side of the piezoelectric substrate and the sides of the slit as $L_1$, and the external dimension of the piezoelectric substrate along one direction as L, then the expression $L_1-g/2=b$, $b<a\leq(3/4)L$ is satisfied.

9 Claims, 5 Drawing Sheets

PIEZOELECTRIC VIBRATION DEVICE

BACKGROUND OF THE INVENTION

1. Field of the Invention

The present invention relates to a piezoelectric vibration device used, for example, as a band filter and, more particularly, to improvements in a piezoelectric vibration device including a plurality of resonance sections provided on a piezoelectric substrate and having a slit arranged to suppress interference between the resonance sections.

2. Description of the Related Art

Energy-trap type piezoelectric filters including a plurality of resonance sections provided on a piezoelectric substrate are known. In this type of piezoelectric filter, since a plurality of resonance sections are provided on the same piezoelectric substrate, a slit is provided in the piezoelectric substrate so as to suppress interference between the resonance section. For example, in Japanese Unexamined Utility Model Publication No. 58-135128, a piezoelectric vibration device is constructed such that two resonance sections are provided on a rectangular piezoelectric substrate, and a slit is provided between the resonance sections so as to extend from one side of the piezoelectric substrate toward the center.

Further, in Japanese Unexamined Utility Model Publication No. 1-59326, a piezoelectric vibration device includes a plurality of vibration sections provided on a piezoelectric substrate and a slit provided between the vibration sections in order to suppress interference between the vibration sections, and lead mounting electrodes are provided on both shoulder sections near the notched opening of the slit. By bonding one lead terminal so as to extend over the lead mounting electrodes on both shoulders, interference between the resonance sections is suppressed, and deformation of the piezoelectric substrate and a decrease in the mechanical strength caused by the formation of the slit are suppressed.

However, in the conventional piezoelectric vibration device in which interference between the resonance sections is suppressed as a result of the slit being provided in the piezoelectric substrate, there is still a problem that although the resonance characteristics are satisfactory, the piezoelectric substrate may sometimes break or crack during handling because the mechanical strength is not sufficient as a result of the slit being formed in the piezoelectric substrate.

SUMMARY OF THE INVENTION

The preferred embodiments of the present invention overcome the problems described above by providing a piezoelectric vibration device having satisfactory resonance characteristics and a sufficient mechanical strength, thereby avoiding the occurrence of breaks or cracks during handling, and including a plurality of resonance sections provided on a piezoelectric substrate and a slit for suppressing interference between the resonance sections.

According to a preferred embodiment of the present invention, a piezoelectric vibration device includes a piezoelectric substrate having an upper major surface and a lower major surface, at least two resonance sections each including a first resonance electrode and a second resonance electrode provided on the upper major surface of the piezoelectric substrate with a gap therebetween and a common electrode provided on the lower major surface of the piezoelectric substrate and opposed to the first and the second resonance electrodes with the piezoelectric substrate disposed therebetween, a slit provided between the resonance sections and extending from one side of the piezoelectric substrate to the piezoelectric substrate along a first direction; and $L_1 - g/2 = b$ and $b < a \leq (\frac{3}{4})L$ being satisfied where a is a length of the slit, g is a gap width between the first and the second resonance electrodes along the opposing direction thereof, $L_1$ is a distance from the center of the gap to the nearest side among the sides of the piezoelectric substrate and the sides of the slit, and L is an external dimension of the piezoelectric substrate along the first direction.

With the above described structure, interference between the resonance sections is reliably suppressed, and an improved and sufficient mechanical strength is achieved without deteriorating the resonance characteristics of the filter.

The above and further objects, aspects and novel features of the invention will become more apparent from the following detailed description in connection with the accompanying drawings.

DETAILED DESCRIPTION OF PREFERRED EMBODIMENTS

Figure 1:
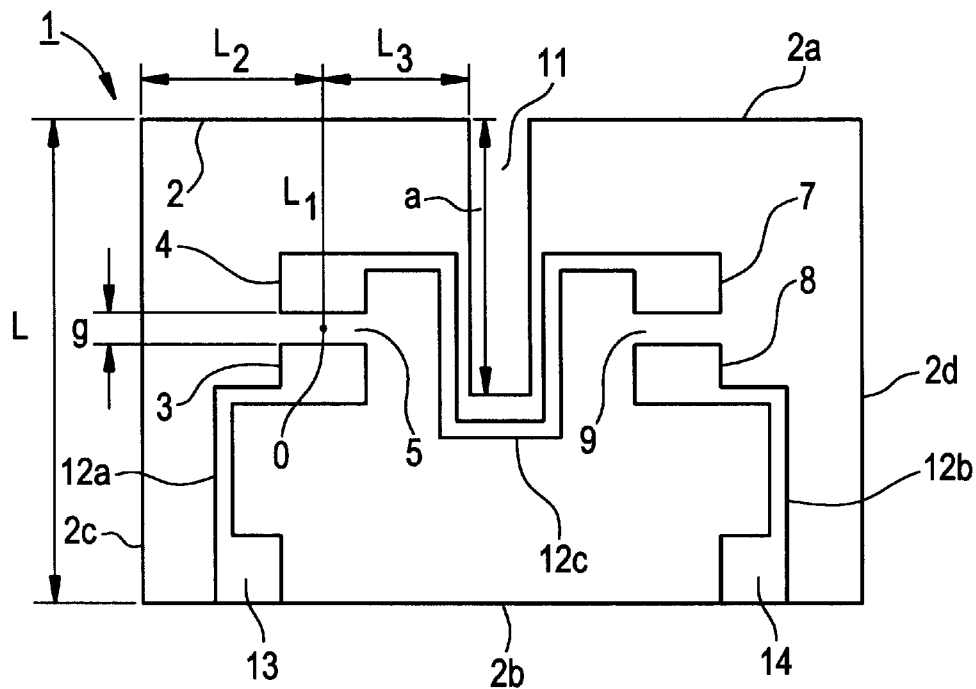
FIG. 1 is a plan view illustrating a piezoelectric vibration device according to a preferred embodiment of the present invention.
Figure 2:
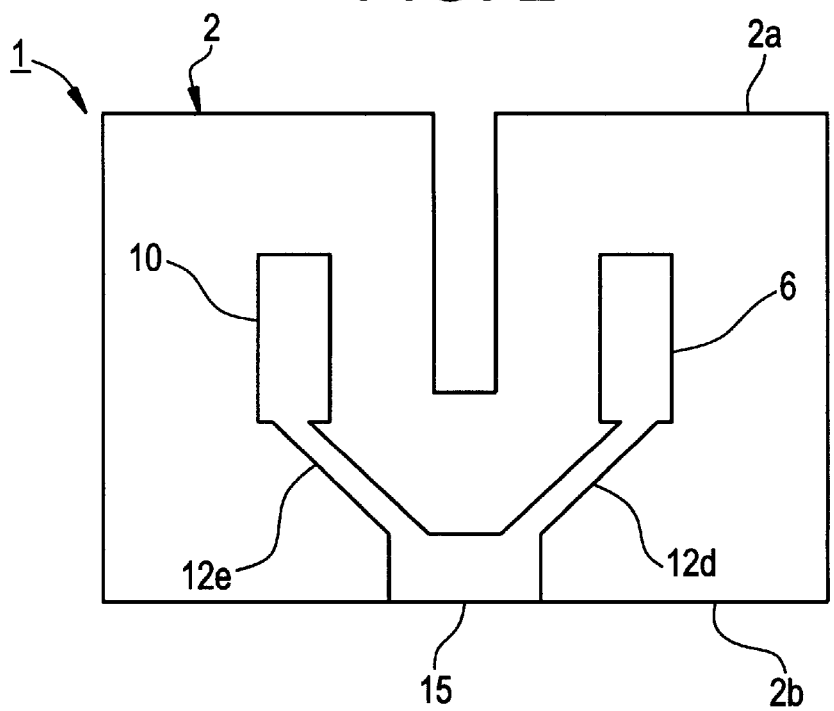
FIG. 2 is a bottom view illustrating the piezoelectric vibration device according to a preferred embodiment of the present invention.

FIGS. 1 and 2 are respectively a plan view and a bottom view showing a piezoelectric vibration device according to a preferred embodiment of the present invention.

This piezoelectric vibration device 1 is preferably a piezoelectric filter having two energy-trap type resonance sections vibrating in a thickness extensional vibration mode. The piezoelectric vibration device 1 is constructed by using a substantially rectangular piezoelectric substrate 2. The piezoelectric substrate 2 may be made of a piezoelectric ceramic, such as a titanate-zirconate-lead-type ceramic, or a piezoelectric single crystal, such as a quartz crystal. When a piezoelectric ceramic is used, the piezoelectric substrate 2 is polarized in the thickness direction at least in first and second resonance sections to be described later.

In order to form a first resonance section, first and second resonance electrodes 3 and 4 are arranged to oppose each other with a gap 5 therebetween on the upper major surface of the piezoelectric substrate 2. On the lower major surface of the piezoelectric substrate 2, as shown in FIG. 2, a common electrode 6 is provided so that it opposes the first and second resonance electrodes 3, 4 with the piezoelectric substrate 2 located therebetween.

In order to form a second resonance section spaced by a predetermined distance from the portion where the first resonance section is provided, first and second resonance electrodes 7 and 8 are provided on the upper major surface of the piezoelectric substrate 2 so as to oppose each other with a gap 9 therebetween. A common electrode 10 is provided on the lower major surface of the piezoelectric substrate 2 so that it opposes the first and second resonance electrodes 7 and 8 with the piezoelectric substrate located therebetween.

In order to suppress interference between the first and second resonance sections, a slit 11 is arranged to extend from a side 2a of the piezoelectric substrate 2 toward the center thereof.

The first resonance electrode 3 is connected to an input electrode 13 provided near a side 2b opposite to the side 2a of the piezoelectric substrate 2 via a connecting conductive section 12a. The second resonance electrode 8 is electrically connected to an output electrode 14 provided on the upper major surface of the piezoelectric substrate 2 near the side 2b of the piezoelectric substrate 2 via a connecting conductive section 12b.

The second resonance electrode 4 of the first resonance section and the first resonance electrode 7 of the second resonance section are connected to each other by a connecting conductive section 12c provided on the upper major surface of the piezoelectric substrate 2.

On the other hand, on the lower major surface of the piezoelectric substrate 2, the common electrodes 6 and 10 are connected to a grounding electrode 15 by connecting conductive sections 12d and 12e, respectively. The grounding electrode 15 is provided near the side 2b on the lower major surface of the piezoelectric substrate 2.

A feature of the piezoelectric vibration device 1 of this preferred embodiment is that, $L_1-g/2=b$ and $b<a \leq (3/4)L$ is satisfied where a is a length of the slit, g is a gap width between the first and the second resonance electrodes along the opposing direction thereof, $L_1$ is a distance from the center of the gap to the nearest side among the sides of the piezoelectric substrate and the sides of the slit, and L is a external dimension of the piezoelectric substrate along the first direction.

By satisfying the above-described relationship, it is possible to suppress interference between the first and second resonance sections and to ensure a sufficient mechanical strength of the piezoelectric vibration device 1. This will be described on the basis of a specific experimental example.

In an example of the piezoelectric vibration device 1, the above-described external dimension is L=3.5 mm, and the shorter of the distances from the center O of the gap to the sides 2a and 2b of the piezoelectric substrate 2, that is, the distance from the center of the gap to the shorter side among the side 2a on which the slit of the piezoelectric substrate 2 is provided and the side 2b opposite to the side 2a, is denoted as $L_1$. In the piezoelectric substrate portion between the side 2c of the piezoelectric substrate on which the first resonance section is provided and the slit 11, the shorter of the distance from the center O of the gap to a side 11a of the slit 11 and the distance from the center of the gap to the side 2c or 2d which extends substantially parallel to the slit on the opposite side of the slit is denoted as $L_2$, and the longer distance is denoted as $L_3$, L=3.5 mm, $L_1=L_2=1.3$ mm, and $L_2+L_3=2.5$ mm. Under these conditions, piezoelectric filters having a center frequency of about 10.7 MHz were produced with the length of the slit 11 being changed in various ways.

With the length a of this slit being varied, the amount of attenuation at a frequency of about 300 kHz or about 350 kHz away from the center frequency was measured. The results are shown in FIGS. 4 to 7.

Figure 4:
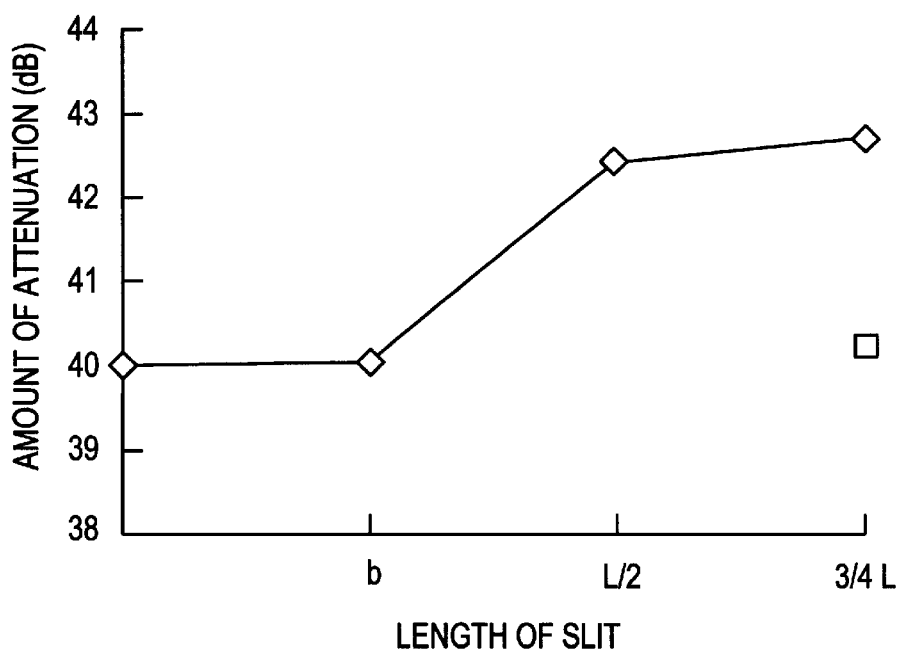
FIG. 4 is a view showing the relationship between the length of the slit and the amount of attenuation at a detuning point 300 kHz lower than the center frequency.
Figure 5:
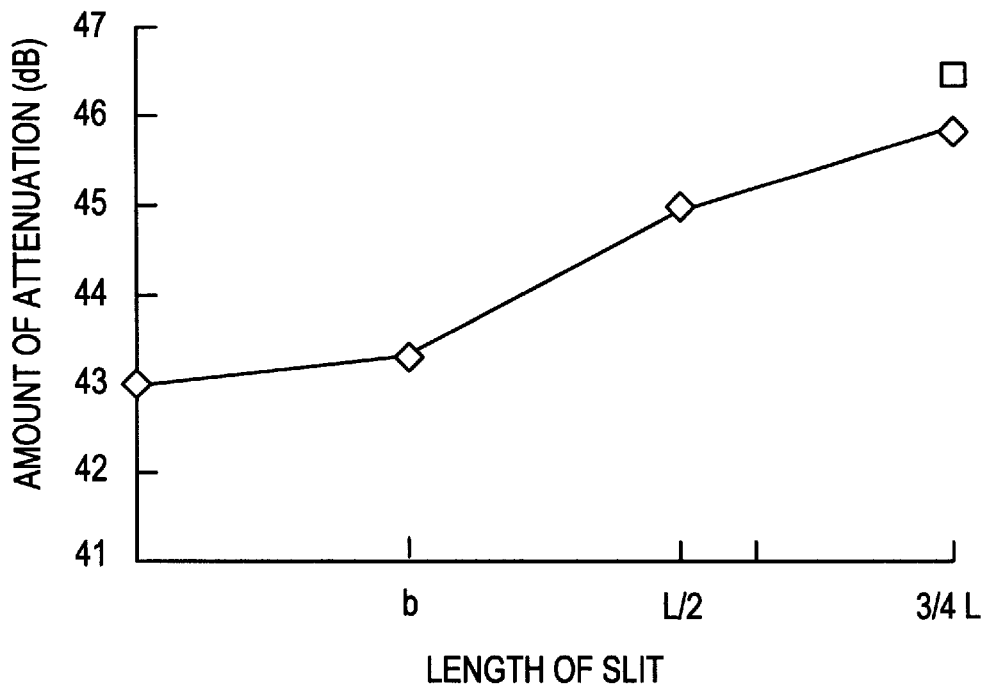
FIG. 5 is a view showing the relationship between the length of the slit and the amount of attenuation at a detuning point 300 kHz higher than the center frequency.
Figure 6:
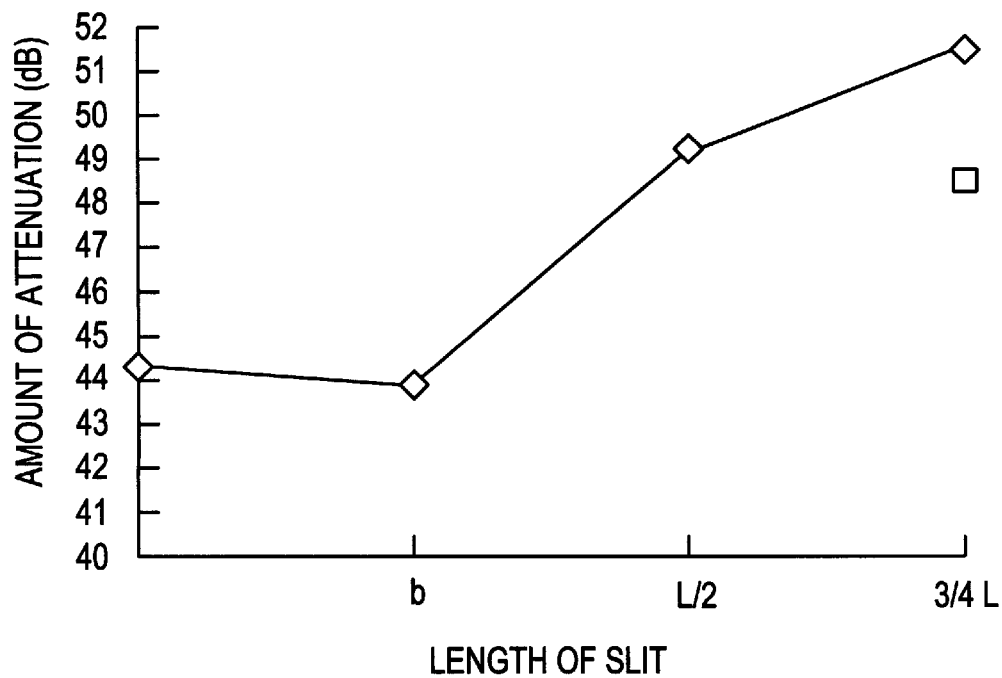
FIG. 6 is a view showing the relationship between the length of the slit and the amount of attenuation at a detuning point 350 kHz lower than the center frequency.
Figure 7:
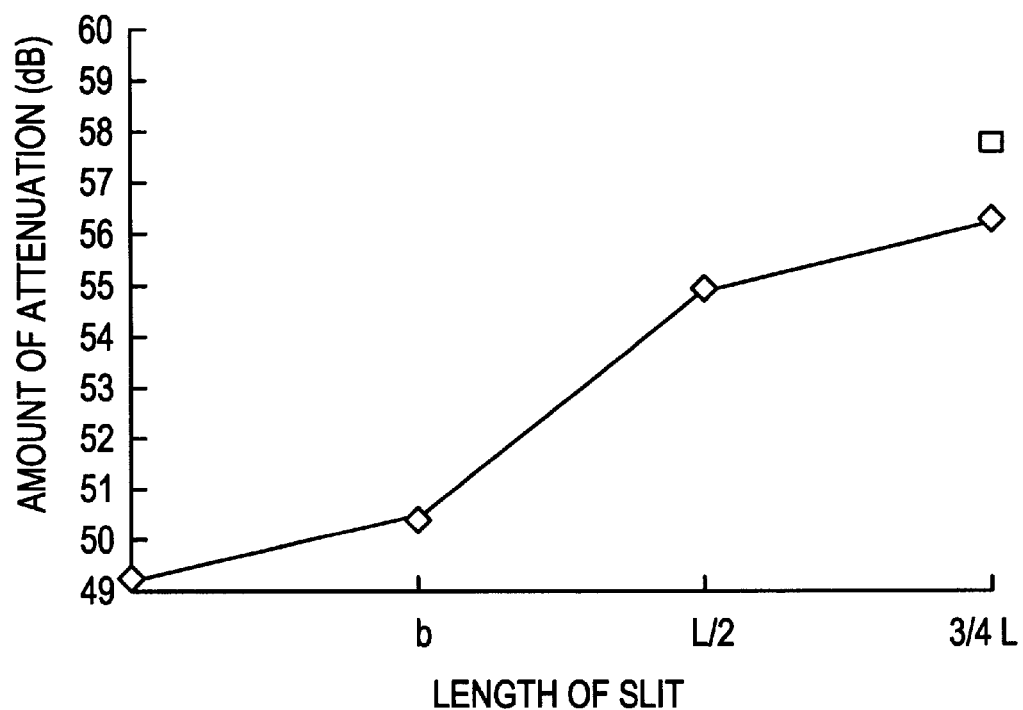
FIG. 7 is a view showing the relationship between the length of the slit and the amount of attenuation at a detuning point 350 kHz higher than the center frequency.

FIG. 4 shows the relationship between the length of the slit and the amount of attenuation at a frequency of about 300 kHz lower than the center frequency. FIG. 5 shows the relationship between the length of the slit and the amount of attenuation at a frequency of about 300 kHz higher than the center frequency. FIG. 6 shows the relationship between the length of the slit and the amount of attenuation at a frequency of about 350 kHz lower than the center frequency. FIG. 7 shows the relationship between the length of the slit and the amount of attenuation at a frequency of about 350 kHz higher than the center frequency.

As is clear from FIGS. 4 to 7, on the basis of the attenuation characteristics at each detuning point of the center frequency $f_0=300$ kHz and $f_0=350$ kHz, sufficient attenuation characteristics are achieved by making the length a of the slit 11 longer than a=b, that is, by making the length a of the slit 11 deeper than $L_1-g/2$, and a necessary filter characteristic can be ensured, in particular, for use as a conventional band filter in an FM radio.

Figure 3A:
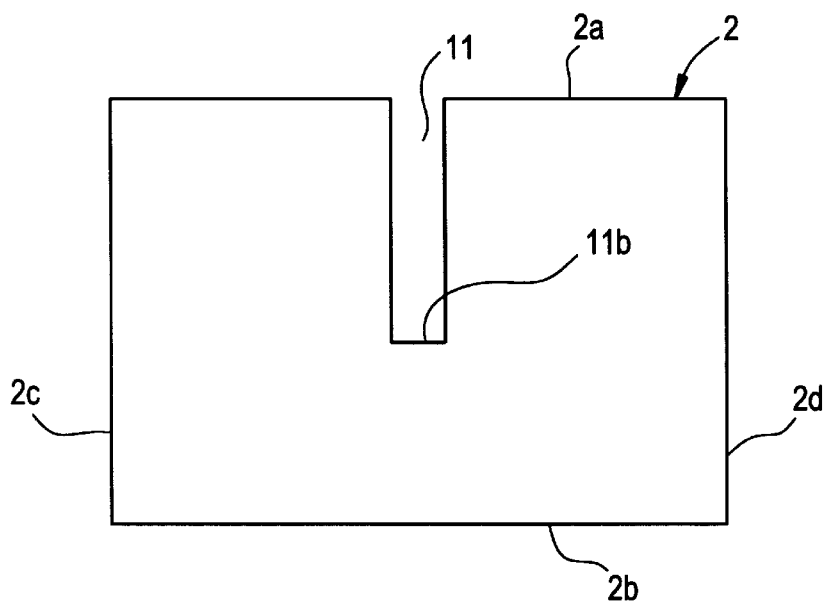
FIG. 3(a) is a schematic plan view illustrating a method of measuring the deflective strength of the piezoelectric vibration device of a preferred embodiment of the present invention.
Figure 3B:
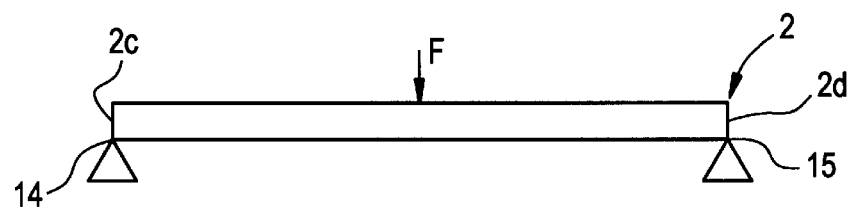
FIG. 3(b) is a schematic front view illustrating a method of measuring the deflective strength of the piezoelectric vibration device of a preferred embodiment of the present invention.
Figure 8:
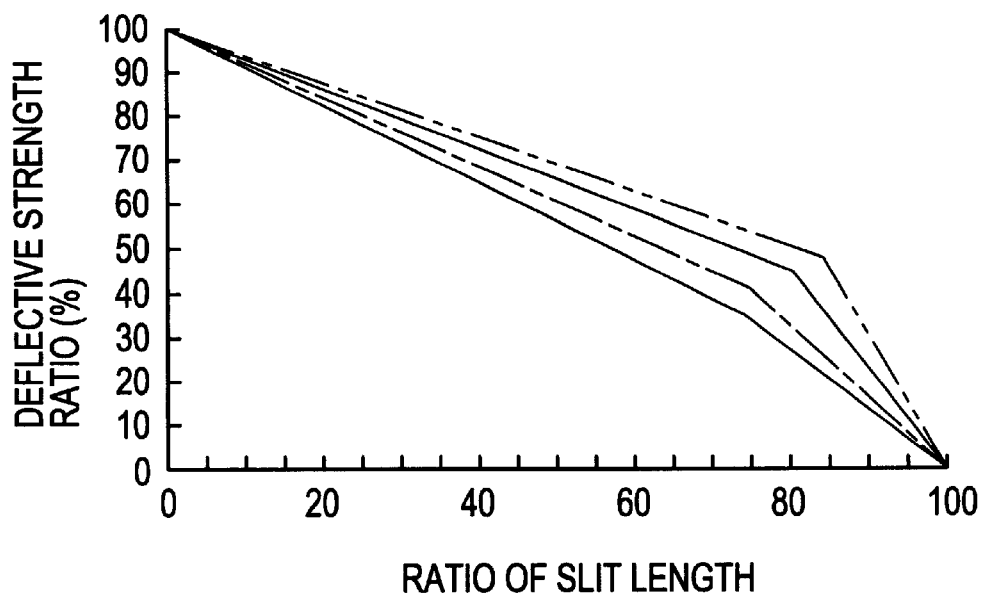
FIG. 8 is a view showing the relationship between the ratio of the slit length and the deflective strength ratio of the piezoelectric substrate.

In a piezoelectric vibration device which satisfies the above-described conditions, the depth of the slit 11 of the piezoelectric substrate 2 of the piezoelectric vibration device 1 was changed in various ways from the viewpoint of device strength, and the deflective strength was measured. FIG. 8 shows the relationship between the deflective strength ratio and the ratio of the slit length. The ratio of the slit length indicates the ratio (%) of the slit length with respect to the external dimension L of the piezoelectric substrate. The deflective strength ratio is a ratio (%) of a minimum value to the value when a slit is not provided, the minimum value being such that, as schematically shown in FIGS. 3(a) and 3(b), the lower major surface of the piezoelectric substrate 2 is supported by fulcrums 14 and 15 near the sides 2c and 2d of the piezoelectric substrate 2 of the piezoelectric vibration device 1, an external force F is applied from above to the center of the substrate portion between the innermost section 11b of the slit 11 and the side 2b of the piezoelectric substrate 2, and the minimum value of the external force F when the piezoelectric substrate 2 is damaged is measured.

The solid line in FIG. 8 indicates the dimension between the sides 2a and 2b of the piezoelectric substrate 2, that is, the result of the case where the external dimension L along the first direction is about 2 mm, the one-dash chain line indicates the result of about 3 mm, the broken line indicates the result of about 4 mm, and the two-dash chain line indicates the result of about 5 mm.

As is clear from FIG. 8, in the case where the external dimension L of the piezoelectric substrate 2 is approximately 2 to 5 mm, when the length a of the slit 11 exceeds 75% of the external dimension L, the deflective strength deteriorates sharply. Therefore, it can be seen that regardless of the value of L, the length a of the slit 11 should be less than or equal to (¾)L.

Therefore, the results of FIGS. 4 to 7, and FIG. 8 show that in order to secure the amount of attenuation at a detuning point by suppressing interference between the resonance sections and to obtain a sufficient device strength, the length a of the slit 11 should be greater than b and less than or equal to about (¾)L.

Further, in the case where the piezoelectric filter with the above-described center frequency is constructed, when the external dimension L of the piezoelectric substrate 2 along the first direction is less than about 2.0 mm, even if the length of the slit 11 is varied, it was confirmed that the device strength may deteriorate similarly. Therefore, when the piezoelectric vibration device 1 with the above-described center frequency is constructed, the external dimension L of the piezoelectric substrate 2 along the first direction should preferably be greater than or equal to about 2.0 mm.

Figure 9:
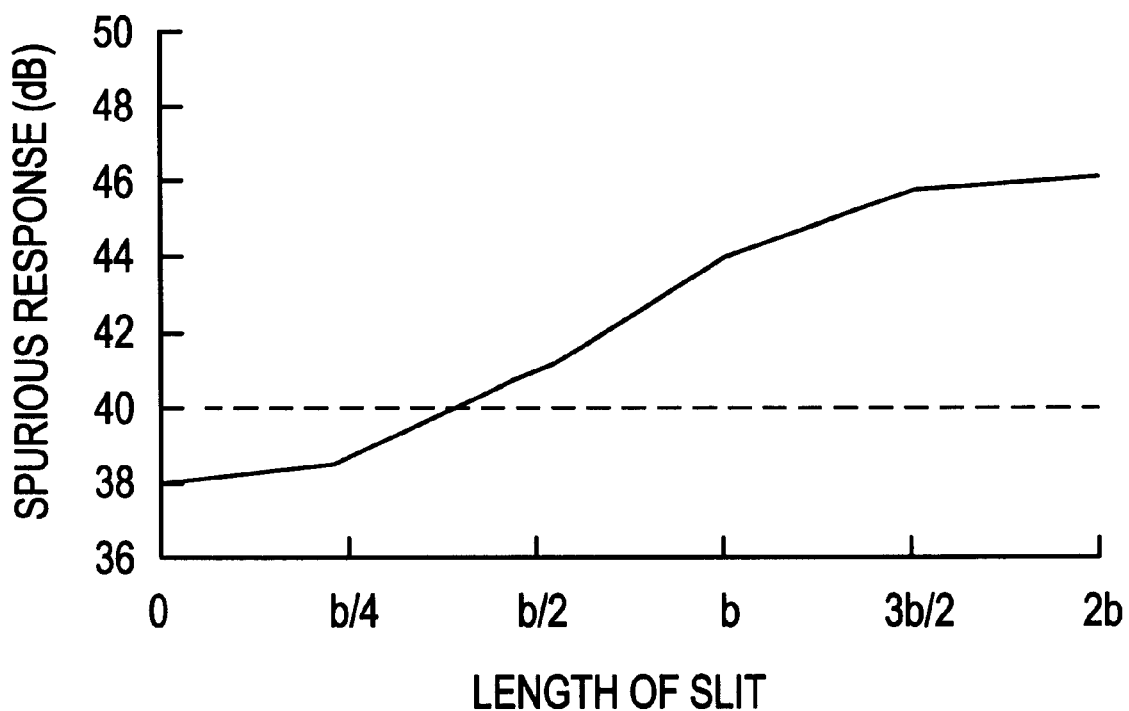
FIG. 9 is a view showing the relationship between the length of the slit and a spurious-response reduction effect.

Further, the applicants of the present invention changed the length of the slit 11 in various ways and confirmed through actual examples of preferred embodiments, the way spurious responses occur. The results are shown in FIG. 9, which shows the relationship between the length of the slit 11 and a spurious-response reduction effect. In this case, the spurious-response reduction effect (dB) refers to a minimum attenuation amount within the frequency range of a width of about 500 kHz to about 1 MHz. It was determined that the greater the value of the spurious response reduction effect, the more spurious responses are reduced.

As is clear from FIG. 9, when the length a of the slit 11 exceeds about b/4, the spurious-response reduction effect becomes greater with an increase in the length of the slit. Further, the spurious-response reduction effect required when the filter is used as a band filter of an FM radio receiver is conventionally recognized to be greater than or equal to about 40 dB. Therefore, FIG. 9 shows that, in a piezoelectric filter used for the above-described applications, if the length of the slit 11 is greater than or equal to b, a spurious-response suppression effect greater than or equal to about 40 dB can be obtained at stable levels.

Furthermore, of the dimensions of the piezoelectric substrate 2, in the case where the difference between dimensions $L_2$ and $L_3$ is less than about 2.0 mm, dimension $L_2$ is less than about 0.8 mm, or dimension $L_3$ is less than about 0.8 mm, a resonance section and a vibration area required for trapping energy cannot be sufficiently secured because the slit 11 is provided, and the characteristics are deteriorated. Therefore, preferably, the dimension $L_2$ should be greater than or equal to about 0.8 mm. Similarly, $L_2+L_3$ should preferably be greater than or equal to about 2.0 mm, and the dimension $L_3$ should preferably be greater than or equal to about 0.8 mm.

Many different embodiments of the present invention may be constructed without departing from the spirit and scope of the present invention. It should be understood that the present invention is not limited to the specific preferred embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A piezoelectric vibration device, comprising:

a piezoelectric substrate having an upper major surface and a lower major surface;

at least two resonance sections each including a first resonance electrode and a second resonance electrode provided on the upper major surface of the piezoelectric substrate with a gap therebetween and a common electrode provided on the lower major surface of the piezoelectric substrate and opposed to the first and second resonance electrodes such that the piezoelectric substrate is located therebetween;

a slit provided between the at least two resonance sections and extending from one side of the piezoelectric substrate to a central portion of the piezoelectric substrate along a first direction; and $L_1-g/2<a\leq(¾)L$ being satisfied where a is the length of the slit, g is the gap width between the first and the second resonance electrodes along an opposing direction thereof, $L_1$ is the distance from a center of the gap to a nearest side among the sides of the piezoelectric substrate and sides of the slit, and L is the external dimension of the piezoelectric substrate along the first direction.

2. The piezoelectric vibration device according to claim 1, wherein the length a of the slit is less than or equal to about (¾)L.

3. The piezoelectric vibration device according to claim 1, wherein the length a of the slit is greater than $(L_1-g/2)$ and less than or equal to about (¾)L.

4. The piezoelectric vibration device according to claim 1, wherein the external dimension L of the piezoelectric substrate along the first direction is greater than or equal to about 2.0 mm.

5. The piezoelectric vibration device according to claim 1, wherein the dimension $L_2$ is greater than or equal to about 2.0 mm, wherein $L_2$ is the shorter distance from the center of the gap to the side of the slit and from the center of the gap to the side of the piezoelectric substrate which extends substantially parallel to the slit on the opposite side of the slit.

6. The piezoelectric device according to claim 1, wherein $L_2+L_3$ is greater than or equal to about 2.0 mm, wherein $L_2$ is the shorter distance from the center of the gap to the side of the slit and from the center of the gap to the side of the piezoelectric substrate which extends substantially parallel to the slit on the opposite side of the slit, and wherein $L_3$ is the longer distance from the center of the gap to the side of the slit and from the center of the gap to the side of the piezoelectric substrate which extends substantially parallel to the slit on the opposite side of the slit.

7. The piezoelectric device according to claim 1, wherein the dimension $L_3$ is greater than or equal to about 0.8 mm, wherein $L_3$ is the longer distance from the center of the gap to the side of the slit and from the center of the gap to the side of the piezoelectric substrate which extends substantially parallel to the slit on the opposite side of the slit.

8. The piezoelectric device according to claim 1, wherein the piezoelectric substrate is substantially rectangular.

9. The piezoelectric device according to claim 1, wherein the piezoelectric substrate is made of a piezoelectric ceramic.

* * * * *